United States Patent [19]

Biefeld et al.

[11] Patent Number: 5,032,435

[45] Date of Patent: Jul. 16, 1991

[54] UV ABSORPTION CONTROL OF THIN FILM GROWTH

[75] Inventors: Robert M. Biefeld; Gregory A. Hebner; Kevin P. Killeen, all of Albuquerque, N. Mex.; Steven P. Zuhoski, Hopewell Junction, N.Y.

[73] Assignee: The United States of America as represented by the United States Department of Energy, Washington, D.C.

[21] Appl. No.: 328,918

[22] Filed: Mar. 27, 1989

[51] Int. Cl.$^5$ .................. B05D 00/00; B05D 3/06; B05C 11/00; B05C 11/02
[52] U.S. Cl. ........................... 427/8; 427/10; 427/54.1; 118/708; 118/712; 118/50.1; 118/620
[58] Field of Search ............... 427/10, 9, 8, 54.1; 118/708, 712, 620, 50.1

[56] References Cited

U.S. PATENT DOCUMENTS

| | | | |
|---|---|---|---|
| 3,654,109 | 4/1972 | Hohl et al. | 427/9 |
| 4,292,341 | 9/1981 | Marcuse et al. | 427/8 |
| 4,311,725 | 1/1982 | Holland | 427/10 |
| 4,332,833 | 6/1982 | Aspnes et al. | 427/9 |
| 4,711,790 | 12/1987 | Morishige | 427/10 |

OTHER PUBLICATIONS

J. Butler et al., "In Situ, Real-Time Diagnostics of OMVPE Using IR-Diode Laser Spectroscopy", *Journal of Crystal Growth*, vol. 77, 1986, pp. 163–171.
R. Sillmon et al., "An Ultra-Fast Gas Delivery System For Producing Abrupt Compositional Switching In OMVPE", *Journal of Crystal Growth*, vol. 77, 1986, pp. 73–78.
V. Donnelly et al., "Development of Laser Diagnostic Probes For Chemical Vapor Deposition of InP/InGaAsP Epitaxial Layers", *Journal of Applied Physics*, vol. 53, No. 9, Sep. 1982, pp. 6399–6407.
J. Haigh, "The Vapour-Phase Ultraviolet Spectra Of Metallo-Organic Precursors to III-V Compounds", *Journal of Materials Science*, vol. 18, 1983, pp. 1072–1076.
R. Karlicek et al., "UV Absorption Spectroscopy For Monitoring Hydride Vapor-Phase Epitaxy of InGaAsP Alloys", *Journal of Applied Physics*, vol. 60, No. 2, Jul. 15, 1986, pp. 794–799.
V. McCrary et al., "The Ultraviolet Absorption Spectra of Selected Organometallic Compounds Used in the Chemical Vapor Deposition of Gallium Arsenide", *Journal Crystal Growth*, vol. 84, 1987, pp. 253–258.
J. Connor et al., "Flash Photolysis of Trimethylantimony and Trimethylbismuth and the Quenching of Excited Antimony and Bismuth Atoms" *Jour. American Chem. Society*, vol. 93, No. 4, 2/24/71, pp. 822–828.
R. Karlicek et al., "Thermal Decomposition of Metalorganic Compounds Used In the MOCVD of InP", *Journal of Crystal Growth*, vol. 68, 1984, pp. 123–127.
V. Donnelly et al., "Excimer Laser Induced Deposition of InP and Indium-Oxide Films", *Applied Physics Letters*, vol. 44, No. 10, May 15, 1984, pp. 951–953.

*Primary Examiner*—Shrive Beck
*Assistant Examiner*—Marianne L. Padgett
*Attorney, Agent, or Firm*—Karla Ojanen; James H. Chafin; William R. Moser

[57] ABSTRACT

A system for monitoring and controlling the rate of growth of thin films in an atmosphere of reactant gases measures the UV absorbance of the atmosphere and calculates the partial pressure of the gases. The flow of reactant gases is controlled in response to the partial pressure.

7 Claims, 4 Drawing Sheets

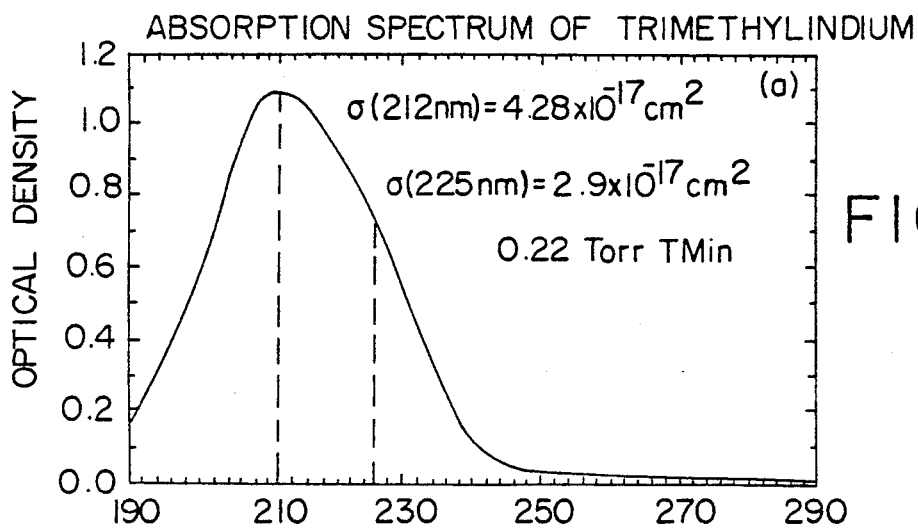
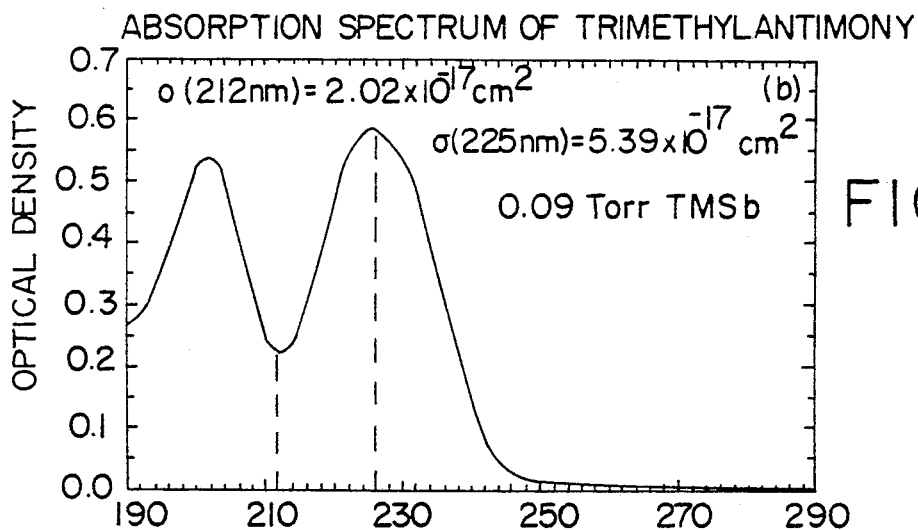
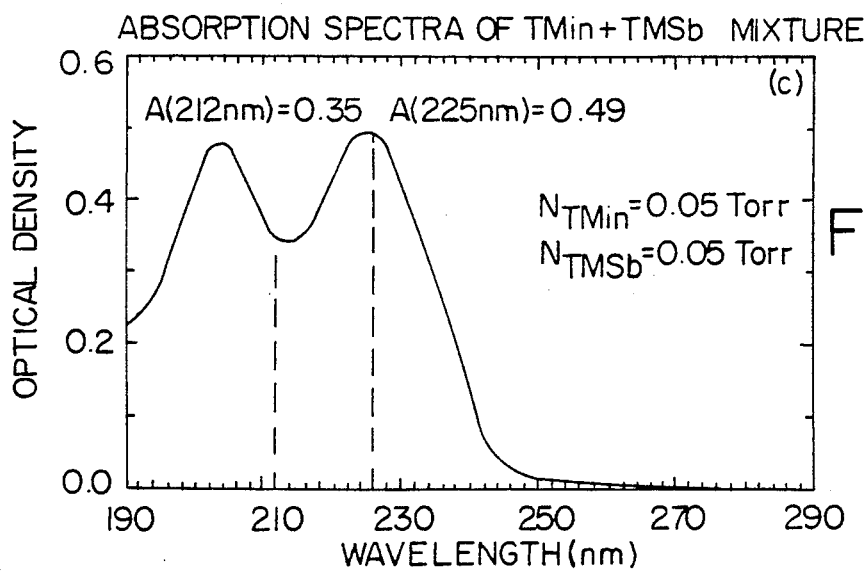

UV ABSORPTION CONTROL OF THIN FILM GROWTH

The United States Government has rights in this invention pursuant to Contract No. DE-AC04-76DP00789 between the Department of Energy and AT&T Technologies, Inc.

BACKGROUND OF THE INVENTION

Thin films of materials such as semiconductors, superconductors, refractory materials, and many others, are of interest for a large variety of technological applications. The growth of thin films, typically by techniques such as chemical vapor deposition and molecular beam epitaxy, requires careful control of growth rates and reactant ratios, as film growth is usually dominated by the concentration of the active species. Precise control of these species is required for the reproducible growth of abrupt interfaces, constant composition layers, and graded junctions.

For example, precise knowledge and control of the relative partial pressures of metal-organics and hydrides is critical to the accurate and reproducible growth of epitaxial layers via metal-organic chemical vapor deposition (MOCVD). The current MOCVD growth technique requires calibration growth runs to determine reactant gas flow stabilization times and dwell times to flush the reactants and halt the growth process. However, subsequent runs may differ from the calibration runs due to unpredictable changes in flow conditions caused by faulty equipment or depleted metal-organic sources.

Reactant partial pressures are currently calculated from measurements of the metal-organic bubbler flow, metal-organic source temperature, back pressure over the source, carrier flow, and growth chamber pressure. A problem with using these calculations for on-line control is that they are based on several measurements which are difficult to accurately obtain.

Several in situ diagnostic techniques have been employed or proposed to provide information on the atmospheric conditions inside the growth chamber.

Coherent Antistokes Raman Spectroscopy (CARS) monitors the partial pressure of $AsH_3$ concentration at a specific point in the reaction tube as a function of time. However, CARS requires two high quality, precisely aligned, lasers and, therefore, is not well suited for production operations.

Infrared absorption spectroscopy of metal-organics and hydrides utilizing an infrared laser diode with a multiple pass cell has been used to monitor partial pressures of the metal-organics and observe reaction products due to decomposition. The complexity of the cell design, the cost of the measurement apparatus, and the effects of the measurement on the growth environment preclude its widespread implementation as a diagnostic tool.

Techniques which are capable of monitoring the concentration of reactants in chemical vapor deposition reactors include mass spectroscopy, infrared diode laser spectroscopy, laser diagnostic probes, and ultraviolet (UV) absorption spectroscopy. It is this invention that recognizes the advantages of using UV absorption spectroscopy for reactant control.

SUMMARY OF THE INVENTION

It is an object of this invention to use UV absorbance to monitor and control thin film growth.

It is another object of this invention to use UV absorbance to determine and adjust the partial pressures of reactant gases during thin film growth.

It is also an object of this invention to provide direct control of the partial pressures of reactant gases during thin film growth as a function of their partial pressures within the chamber.

It is still another object of this invention to provide direct control of reactants in their input lines to the growth chamber.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of this invention as embodied and broadly described herein, the present invention may comprise a method for monitoring and controlling the growth of thin films on a substrate in a controlled atmosphere in a chamber. An input system puts a reactant gas into the chamber where some portion of the reactant gas will be incorporated into the thin film. An exhaust system removes the remaining portion of the reactant gas from the chamber. In a first embodiment of the invention, measuring means are provided for measuring the UV absorbance of the gas at a particular wavelength. In a second embodiment, control means adjust the concentration of reactant entering said chamber through the input system as a function of the measured absorbance of the gas at the particular wavelength.

In addition, the invention also is a method of monitoring and controlling the growth of thin films comprising measuring the UV absorbance of gases; calculating the partial pressure of the gases from the UV absorbance measurements; and adjusting the partial pressure of the reactant gases in the chamber in response to the calculated pressures.

BRIEF DESCRIPTION OF THE DRAWINGS

The accompanying drawings, which are incorporated in and form part of the specification, illustrate an embodiment of the present invention and, together with the description, serve to explain the principles of the invention.

FIGS. 2a–2c show UV absorbance spectra of materials used for the growth of thin films in the embodiment of FIG. 1.

DETAILED DESCRIPTION OF THE INVENTION

Figure 1:
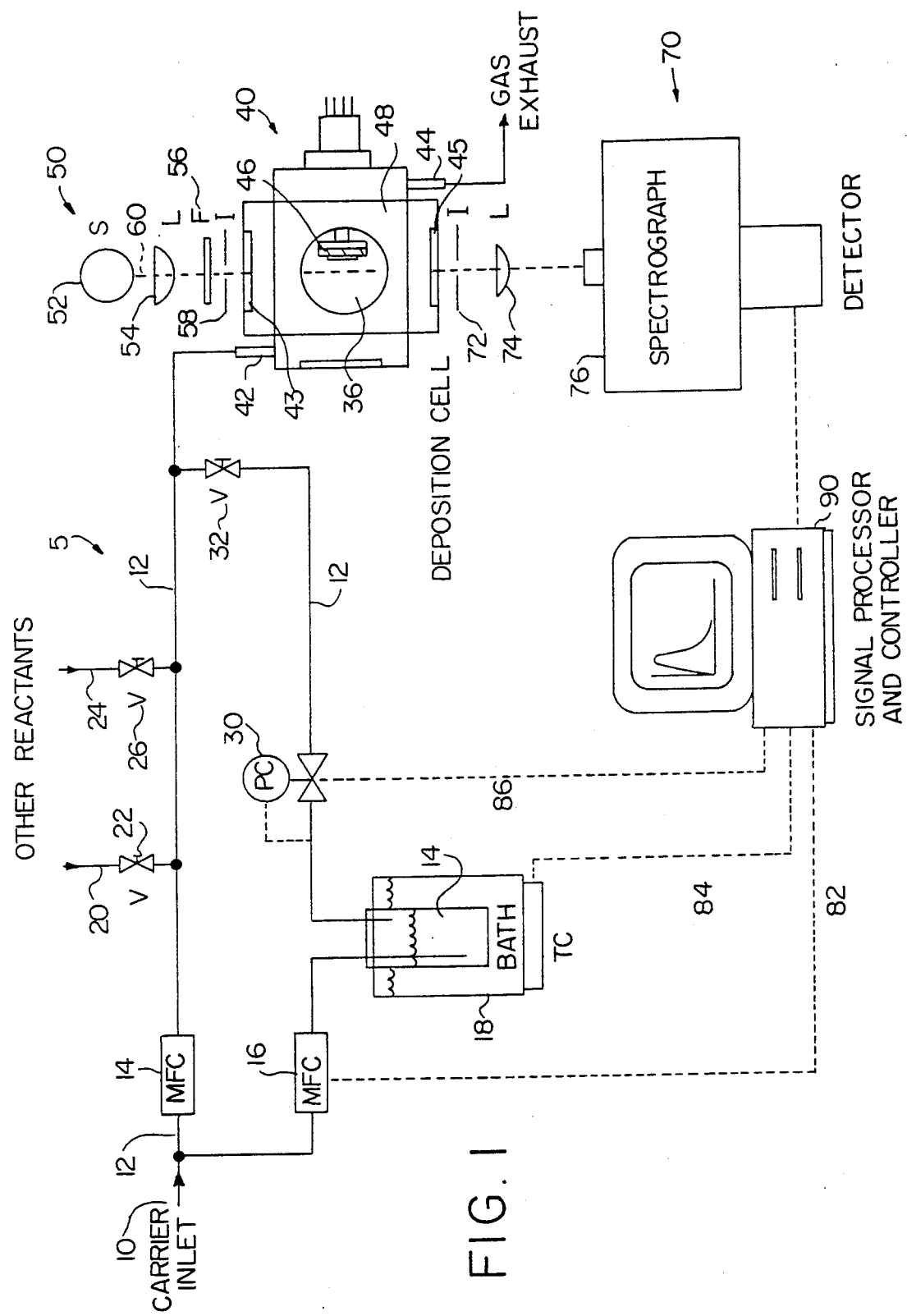
FIG. 1 shows a schematic representation of an embodiment of the invention.

FIG. 1 shows a first embodiment of the invention for monitoring and controlling the active reactants in a MOCVD system. The system includes a deposition chamber 40 consisting of a 1 inch diameter, resistively heated, molybdenum susceptor 46 inside a 4.5 inch ultra high vacuum cube, stainless steel cube 48. The atmosphere inside cube 48 consists of reactant and carrier gases from input system 5 which enter chamber 40 through input 42 and which exhaust through exhaust line 44 in a manner well known in this art.

Input system 5 is shown to include stainless steel tubing 12 for carrying reactant gases 20 and 24, and carrier gas 10. Carrier gas 10 is divided into a first path through mass flow controller (MFC) 14 to junctions with the output of valve 22, controlling reactant 20, and value 26, controlling reactant 24. The second path for carrier gas 10 proceeds through MFC 16 to a constant-temperature bath 18 for a liquid or solid reactant 19. The amount of reactant 19 picked up by the carrier gas is controlled by an active back pressure controller 30. Moreover, it is difficult, if not impossible, to predict the amount of reactant 19 which will be input to chamber 40 because the gas of reactant 19 is not linearly entrained into carrier gas 10. Flow from this line goes through valve 32 to a junction with the first path. This joined output of input system 5 is connected to input 42 of chamber 40. The entire system supports a base vacuum on the order of $5 \times 10^{-7}$ torr.

The system as described above is well known in the art. If carrier gas 10 is hydrogen, reactant gas 20 is trimethylindium (TMIn), and reactant 19 is trimethylantimony (TMSb), a thin InSb film will be deposited on a substrate 36 mounted on susceptor 46 in chamber 40. The invention, as described below, enables the partial pressure of each reactant gas to be measured in the chamber, and the measurement information used to control the partial pressure, and thereby control the rate of growth of the InSb layer.

In accordance with this invention, a UV light source 50 generates a UV beam 60 that is directed into chamber 40 through window 43, by substrate 36, and out of chamber 40 through window 45 to a UV detector 70. The absorbance at detector 70 is processed by computer 80 to calculate partial pressure of each reactant gas. Computer 80 can adjust one or more of the valves and controllers in input system 5 to change each partial pressure to a desired value.

One simple embodiment of UV source 50 comprises a 40 Watt deuterium lamp 52 with a constant current supply as a source of UV light with a long term stability of 0.1%. Lens 54 focuses the light onto a 200 nm interference filter 56 (30 nm full width, half maximum bandwidth) and iris 58 to direct narrow beam 60 through chamber 40.

Detector 70 may include an output iris 72 and lens 74 to direct beam 60 onto a spectrograph 76 having a 0.27 m monochromator with a 300 nm blaze grating (300 g/mm dispersion), 25 μm slits and an optical multichannel analyzer. This detector permits the measurement of desired wavelengths of UV light. The output of the detector may be manually, or preferably automatically, input to computer 80.

The principal of this invention is that consistent thin film growth will be attained when the partial pressures of the reactant gases are maintained at predetermined values. If N reactant gases are present in chamber 40, measurements of UV absorbance are made at N different wavelengths where the absorption cross section of each reactant is known at each wavelength. N simultaneous equations are then solved to provide the partial pressures of the N gases. An adjustment in one or more controlling valves in input system 5 changes the partial pressures of the gases in chamber 40. For two gases as discussed below, the system is capable of calculating partial pressures in a few milliseconds, so the limiting factor in the reponse of the system to the measurements is the speed of the controlling valves.

The absorbance spectra of pure TMIn and TMSb vapor are shown in FIGS. 2a and 2b, along with the absorption cross sections of each material at two wavelengths (212 and 225 nm). FIG. 2c shows the absorbance spectra measured by the invention for a typical growth mixture of TMIn and TMSb in one atmosphere of hydrogen at 28° C. The partial pressure of TMSb and TMIn in the mixture are determined by the solution of the following equations in computer 80:

$$A_{212} = N_{TMIn} I_{TMIn,212} L + N_{TMSb} I_{TMSb,212} L$$

$$A_{225} = N_{TMIn} I_{TMIn,225} L + N_{TMSb} I_{TMSb,225} L$$

where $A_{225}$ and $A_{225}$ are the measured absorbances of the mixture of FIG. 2c at the two wavelengths; $I$ is the measured absorption cross section of the pure materials as shown in FIGS. 2a and 2b at each wavelength, L is the absorption path length in the cell (the distance between the windows in the chamber), and $N_{TMIn}$ and $N_{TMSb}$ are the partial pressures to be calculated. The absorbance $A = \log(I_o/I)$, where $I_o$ is the incident light intensity at the detector with no gas present, and I is the incident light at the detector after passing through the gas being measured.

The rapid and accurate monitoring of reactant absorbance provided by this invention also permits other parameters of the growth system to be measured. For example, the time required for reactant gas concentration to stabilize in a MOCVD reactor is of critical importance for the fabrication of abrupt interfaces and well-defined graded junctions.

Figure 3:
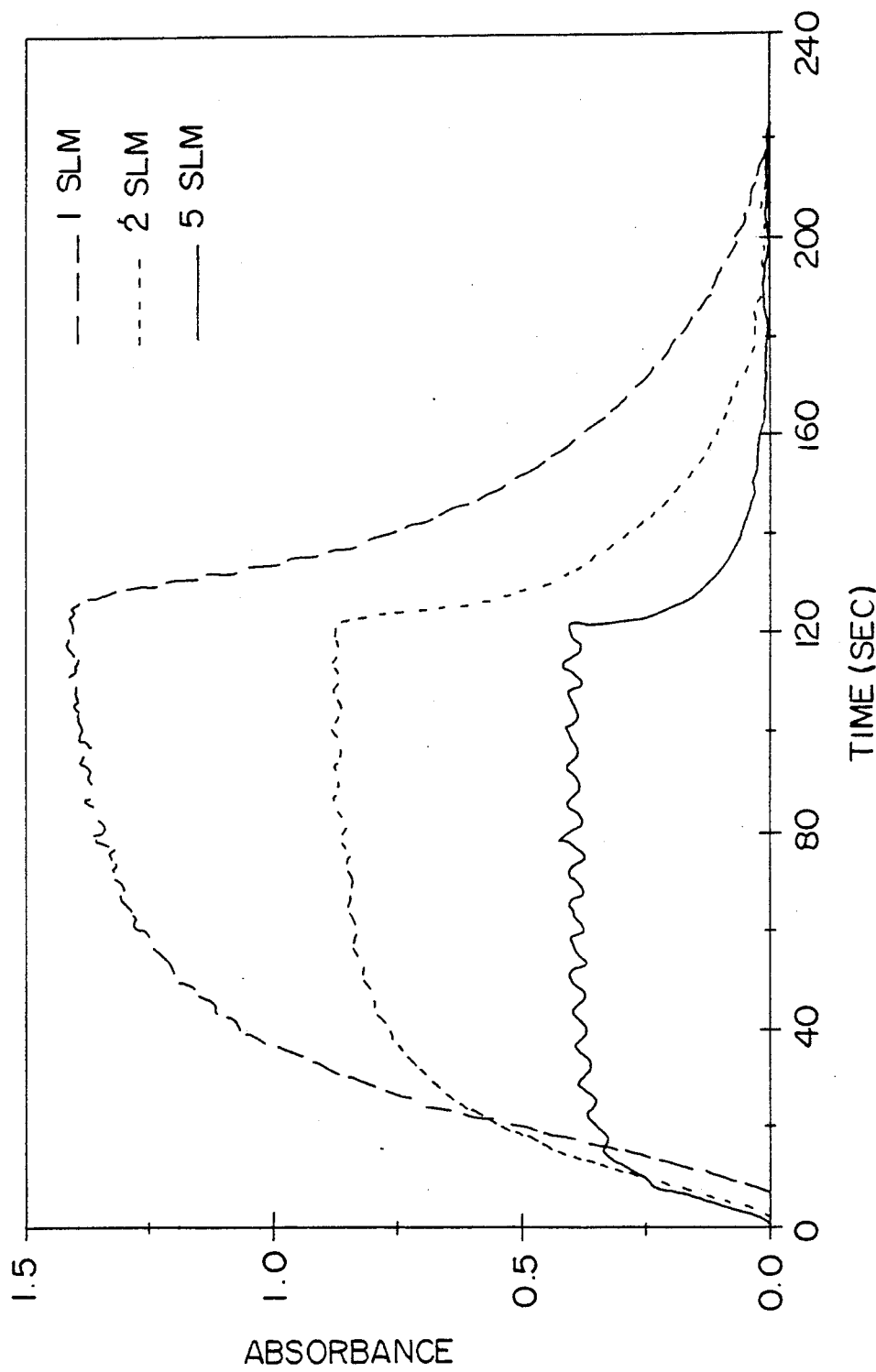
FIG. 3 shows UV absorbance as a function of carrier flow rate.

FIG. 3 shows transient response of an inverted stagnation point reactor to several carrier gas flow rates. A TMSb bubbler is maintained at −19° C. with a mass flow of 25 sccm at a back pressure of 620 torr, and the growth chamber pressure is maintained at 600 torr by a downstream pressure control. The TMSb, in a run/bypass configuration, is introduced into the reaction chamber at t=0 seconds and the absorbance is monitored 0.5 cm below the cold susceptor. At t=120 seconds the TMSb is shunted to the bypass and the metalorganic species in the cell are slowly exhausted. Typical velocities in the reaction chamber range from about 0.5 to 3 cm/s for hydrogen flow rates of 1 to 6 SLPM. For maximum sensitivity, the TMSb is observed in absorbance at the peak of one of the two absorbance maxima, 225 nm.

The results of this measurement in accordance with this invention show that increasing the hydrogen carrier flow while maintaining a constant system pressure and metal-organic mass flow has several effects. Increased carrier flow and flow velocity result in a shorter initial turn on time before any absorbance is observed below the susceptor, a large increase in the rate of rise to the maximum absorbance, and an associated decrease in the time required to reach an equilibrium value. Another observed effect is the general dilution of the metal-organics as manifested by a reduction in absorbance. These results show that a long turn on or turn off time will result in a graded junction at an interface of, for example, InSb/InAsSb if the As source is turned off.

FIG. 3 also illustrates the value of the invention as a diagnostic tool for process instabilities. The ripples in the data show a 5% absorbance variation over a 6 second period, the result of instabilities in the down stream pressure control system. Adjustment of this control eliminated these variations. In contrast to the absorbance spectra of FIG. 3, the pressure transducer on the system registered a variation of less than 1 torr out a total pressure of 600 torr, a 0.002% deviation. Thus the pressure tranducer, a traditional measurement device, was relatively insensitive to the large variation in metal-organic concentration, while the UV absorbance provides an accurate representation of concentration at any location within the chamber.

Figure 4:
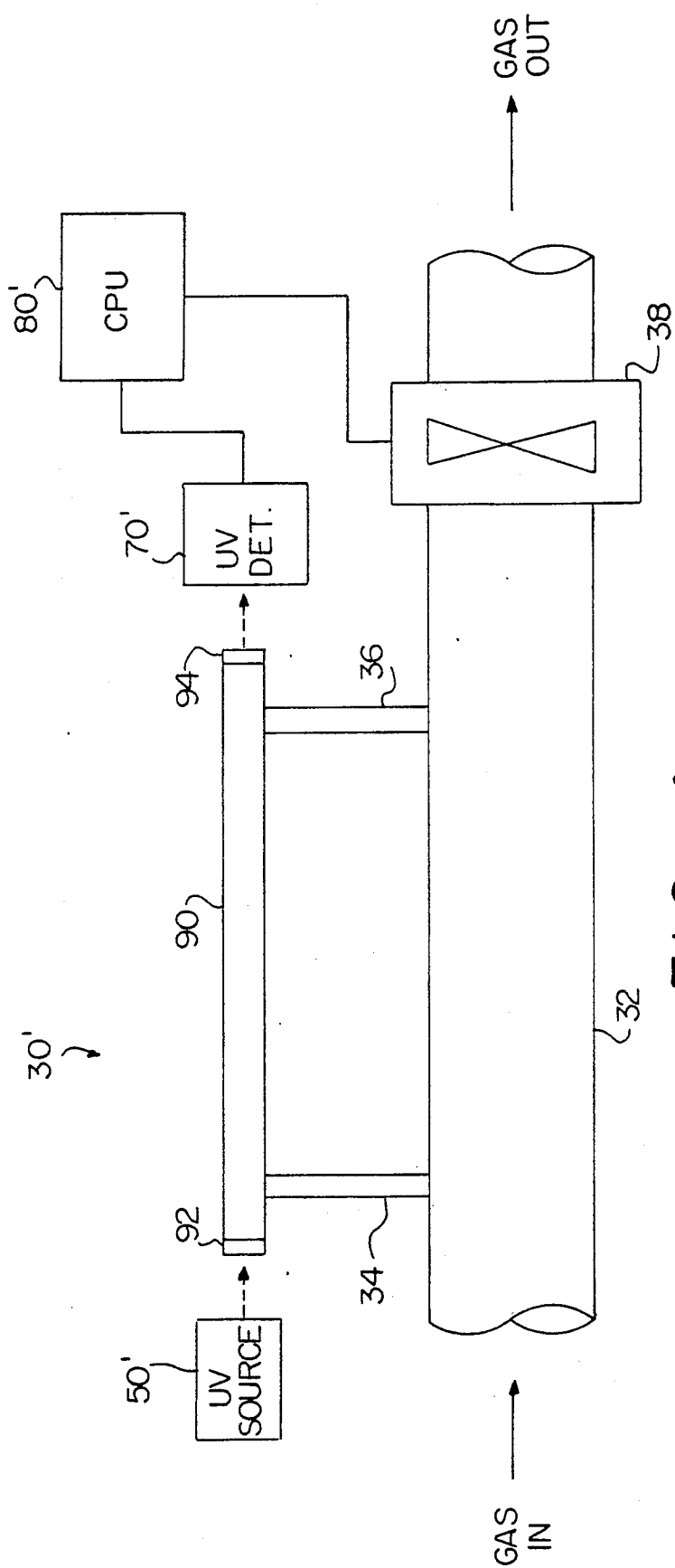
FIG. 4 shows a schematic representation of a second embodiment of the invention.

FIG. 4 illustrates a second embodiment of the invention where an optical mass flow meter 30' monitors and controls one or more of the reactants in the input lines to chamber 40. Meter 30', which could be mounted in input line 12 at the location of controller 30 in FIG. 1, has form typical of a mass flow controller including a relatively large bypass portion 32 serially connected in line 12. A smaller diameter sensor input portion 34 carries a sample of the gas in line 12 to a straight section of absorption tube 90 having UV transparent windows 92, 94 at opposite ends. A smaller diameter sensor output portion 36 returns the sample of gas from tube 90 back to bypass portion 32.

The amount of the single gas in line 12 is measured by UV absorption spectroscopy. In particular, a UV light source 50' transmits a beam of UV light through one of windows 92, 94. A UV detector 70' measures the absorbance at a gas-specific frequency determined by a detector filter. The absorbance may be converted to gas concentration by computer 80' solving the aforementioned equations and used to adjust the amount of this gas proceeding to chamber 40 by control of meter valve 38.

The particular sizes and equipment discussed above are cited merely to illustrate a particular embodiment of this invention. For example, many other growth cell shapes will work with this invention, as long as they provide an optical path for UV absorbance measurements. The optical flow path may include mirrors and may have either the light source or receiver, or both, within the chamber. In addition, the invention contemplates the control of any parameter of the system that would effect the rate of UV absorption. The invention may involve components having different sizes and shapes as long as the principle, using UV absorbance measurements to control the growth process, is followed. It is intended that the scope of the invention be defined by the claims appended hereto.

We claim:

1. As apparatus for monitoring and controlling the growth of thin films comprising:
   (a) a chamber for containing a substrate in a controlled atmosphere, said thin film being grown on the substrate;
   (b) an input system having a tubular means for carrying gases from one or more solid or liquid reactants into said chamber, wherein some portion of each of said gases will be incorporated into the thin film;
   (c) an exhaust system for removing the remaining portion of said gases from said chamber; and
   (d) an ultraviolet absorbance monitor with an optical path through said chamber;
   (e) means for simultaneously measuring the ultraviolet absorbance of the gases at a plurality of wavelengths; and
   (f) means for calculating, using simultaneous equations, the partial pressures of each of said gases.

2. An apparatus for monitoring and controlling the growth rate and composition of thin films comprising:
   (a) a chamber for containing a substrate in a controlled atmosphere, said thin film being grown on the substrate;
   (b) an input system having a tubular means for carrying gases from one or more solid or liquid reactants into said chamber, wherein some portion of each of said gases will be incorporated into the thin film;
   (c) an exhaust system for removing the remaining portion of said gases from said chamber;
   (d) a source of ultraviolet light having a plurality of wavelengths;
   (e) a detector of ultraviolet light;
   (f) an optical path for transmitting said ultraviolet light from said source through said gases to said detector;
   (g) a bypass section in series communication with said tubular means, said bypass section carrying most of the gases flowing through said tubular means; and
   (h) a sensor section in parallel with said bypass section for carrying the remainder of the gases flowing through said tubular means, said sensor section including said optical path.

3. A method for monitoring the growth rate and composition of films comprising:
   (a) establishing a flow of carrier gas through a fabrication chamber having an optical path through said chamber;
   (b) heating a susceptor upon which is mounted a substrate for the growth of a film to a predetermined temperature;
   (c) introducing gases from one or more solid or liquid reactants into said chamber;
   (d) directing a beam of ultraviolet radiation having a plurality of wavelengths along said optical path through said chamber;
   (e) simultaneously, measuring the absorbance of the ultraviolet radiation by the gases;
   (f) using simultaneous equations calculating the partial pressure of each gas using the absorbance at a plurality of wavelengths of each gas;
   (g) correlating the partial pressure of each gas to the growth of the thin film on the substrate.

4. A method for controlling the growth of films comprising the steps of claim 3 and further comprising:
   (h) adjusting the flow rate of one or more of said gases responsive to said partial pressure of each gas to control the growth of thin films.

5. The method of claim 3 or the method of claim 4, wherein said carrier gas is hydrogen.

6. The method of claim 3 or the method of claim 4, wherein said solid or liquid reactant is a metallo-organic compound.

7. The method of claim 6 wherein one of said gases is a hydride.

* * * * *